(12) United States Patent
Meltaus et al.

(10) Patent No.: US 8,925,163 B2
(45) Date of Patent: Jan. 6, 2015

(54) METHOD OF MANUFACTURING LATERALLY COUPLED BAW THIN FILMS

(75) Inventors: Johanna Meltaus, Espoo (FI); Tuomas Pensala, Helsinki (FI); Markku Ylilammi, Espoo (FI); Tommi Riekkinen, Espoo (FI); Tomi Mattila, Espoo (FI)

(73) Assignee: Teknologian Tutkimuskeskus VTT (FI)

( * ) Notice: Subject to any disclaimer, the term of this patent is extended or adjusted under 35 U.S.C. 154(b) by 68 days.

(21) Appl. No.: 13/272,390

(22) Filed: Oct. 13, 2011

(65) Prior Publication Data

US 2012/0086523 A1    Apr. 12, 2012

Related U.S. Application Data

(63) Continuation-in-part of application No. 12/440,743, filed as application No. PCT/FI2007/000232 on Sep. 14, 2007.

(60) Provisional application No. 61/392,955, filed on Oct. 14, 2010.

(30) Foreign Application Priority Data

Sep. 18, 2006    (FI) ..................................... 20060832

(51) Int. Cl.
*H04R 17/00*    (2006.01)
*H03H 9/02*    (2006.01)
*H03H 3/02*    (2006.01)
*H03H 9/56*    (2006.01)
*H03H 9/00*    (2006.01)

(52) U.S. Cl.
CPC ......... *H03H 9/0095* (2013.01); *H03H 9/02125* (2013.01); *H03H 3/02* (2013.01); *H03H 9/562* (2013.01)

USPC ............ 29/25.35; 29/846; 29/592.1; 333/187

(58) Field of Classification Search
USPC .................. 29/592.1, 25.35–25.42, 831–832, 29/846–847; 310/306–328, 343, 163; 333/183–187, 192
See application file for complete search history.

(56) References Cited

U.S. PATENT DOCUMENTS

| | | |
|---|---|---|
| 5,446,306 A | 8/1995 | Stokes et al. |
| 5,801,069 A * | 9/1998 | Harada et al. .................. 438/52 |
| 5,873,153 A * | 2/1999 | Ruby et al. .................. 29/25.35 |
| 6,387,748 B1 | 5/2002 | Agarwal |
| 6,441,539 B1 | 8/2002 | Kitamura et al. |
| 6,507,983 B1 | 1/2003 | Ruby et al. |
| 6,780,792 B2 | 8/2004 | Agarwal |
| 7,140,084 B2 | 11/2006 | Yamada et al. |
| 7,211,933 B2* | 5/2007 | Kawakubo et al. .......... 310/334 |
| 7,258,742 B2 | 8/2007 | Higuchi et al. |
| 7,424,772 B2 | 9/2008 | Larson, III |
| 7,490,390 B2 | 2/2009 | Kawakubo et al. |

(Continued)

*Primary Examiner* — Minh Trinh
(74) *Attorney, Agent, or Firm* — Thorpe North & Western LLP (57) ABSTRACT

The invention describes a manufacturing method for an acoustic balanced-unbalanced (balun) or balanced-balanced thin-film BAW filter based on lateral acoustic coupling. In laterally acoustically coupled thin-film BAW filters (LBAW) one can realize transformation from unbalanced to balanced electric signal if the electrodes of the balanced port are placed on the opposite sides of the piezoelectric film. The manufacturing process is simpler than in the corresponding component based on vertical acoustical coupling. The device can also realize impedance transformation.

16 Claims, 11 Drawing Sheets

(56) References Cited

U.S. PATENT DOCUMENTS

| | | | |
|---|---|---|---|
| 7,728,485 B2 * | 6/2010 | Handtmann et al. | 310/320 |
| 8,471,652 B2 * | 6/2013 | Meister et al. | 333/189 |
| 2003/0189225 A1 | 10/2003 | Agarwal | |
| 2004/0083590 A1 * | 5/2004 | Lee et al. | 29/25.35 |
| 2005/0028336 A1 * | 2/2005 | Robert et al. | 29/25.35 |
| 2006/0185139 A1 | 8/2006 | Larson et al. | |
| 2006/0198599 A1 | 9/2006 | Higuchi | |
| 2012/0086523 A1 * | 4/2012 | Meltaus et al. | 333/187 |

* cited by examiner

Fig. 11c

METHOD OF MANUFACTURING LATERALLY COUPLED BAW THIN FILMS

This application is a Continuation-in-Part of co-pending application Ser. No. 12/440,743 filed on Mar. 11, 2009, and for which priority is claimed under 35 U.S.C. §120; which is a national stage application under 35 U.S.C. §371 of PCT/FI2007/000232 filed Sep. 14, 2007; and this application claims priority of Application No. 20060832 filed in Finland on Sep. 18, 2006 under 35 U.S.C. §119; and further this application claims priority of Provisional Application No. 61/392,955 filed Oct. 14, 2010 under 35 U.S.C. §119(e); the entire contents of all are hereby incorporated by reference.

FIELD OF THE INVENTION

The present invention relates generally to a method of manufacturing bulk acoustic wave filters. More particularly to a method of manufacturing laterally coupled bulk acoustic wave (LBAW) thin film filters.

BACKGROUND OF THE INVENTION

In certain applications, such as radio applications, a conversion from a balanced signal to an unbalanced signal, or vice versa, is often required. Traditionally, the primary way to accomplish a balanced-unbalanced conversion is with a dedicated component. Having a separate component increases the requisite size and cost of such a device. Therefore it is advantageous if a conversion can be realized in another component.

An example of a component that is typically present in devices requiring balanced-unbalanced signal conversion is a filter. Several types of filter arrangements are known which can provide required signal conversion in addition to their standard required filter capabilities.

Bulk acoustic wave (BAW) filters, when arranged using vertical acoustic coupling (CRF), can potentially be used for balanced-unbalanced signal conversion. Balanced BAW filters are realized by vertically coupling two piezoelectric layers. However, due to the presence of two layers, these filters are extremely sensitive to the thickness variations between the piezoelectric layers. An additional disadvantage to using CRF BAW filters is that they are both difficult and expensive to manufacture.

Another type of filter that can be utilized is a surface acoustic wave (SAW) filter. Balun transformation, as well as impedance transformation, can be realized relatively easily in SAW components. However, compared to BAW, SAW components have much worse power handling capabilities. SAW filters have additional distinct disadvantages. SAW filters are often too large to be used in certain devices, specifically in small compact devices. Another disadvantage is that there are difficulties associated with patterning at high frequencies, e.g. above 2 GHz.

Perovskite metal-oxides, such as $Ba_xSr_{1-x}TiO_3$ (hereinafter called "BST"), show exceptional material properties including (i) switchable permanent polarization (ferroelectric phase), (ii) piezoelectricity (ferroelectric phase), (iii) field-dependent (tunable) polarization (paraelectric phase), (iv) low losses at high frequencies (paraelectric phase). Tunability and low losses, typically obtained in the paraelectric phase, make these materials of special interest for high-frequency applications. An example of a basic device realizable using these materials is a tunable capacitor (varactor).

For optimal tunability, parallel-plate device geometry is highly desirable: here the perovskite metal-oxide is sandwiched between two (top and bottom) metallic electrodes. Using planar device geometries based on metal electrodes deposited only on top of the perovskite metal-oxide, it is difficult to obtain sufficient tunability.

In the prior art parallel-plate capacitor fabrication process, the layers are deposited successively on a substrate, ie. the metallic bottom electrode is first deposited on the substrate, then the BST layer is deposited on the metallic bottom electrode and finally the metallic top electrode is deposited on the BST.

High processing temperatures are required for proper crystallization of perovskite oxides (e.g. for BST, $T_{min}$~650° C.). The high temperature and the presence of oxygen make the parallel-plate device processing problematic. The metallic bottom electrode is heavily attacked during BST growth. Typical problems encountered in the bottom electrode are (i) electrode destruction via oxidation, (ii) grain growth resulting in poor BST quality. On the other hand, the electrode material should be well conducting to prevent the critical losses at high frequencies. Of typical metals, Cu, Ag, Al, and Au are well conducting but either get easily oxidized and/or are unstable substrates for BST growth due to their low melting point. A typical state-of-the-art choice for the bottom electrode is Pt, which, however, (i) is a significantly worse conductor than the metals above, (ii) will easily exhibit grain growth if thick layers are employed to reduce conductor losses. Furthermore, Pt is permeable with respect to oxygen, and reactive with respect to other metals—both effects complicating the fabrication of multilayered electrode structures. The refractory metals (Mo, W) are more stable against grain growth and they are intermediate conductors but get easily oxidized. Protective layers (e.g. diffusion barriers) can in principle be employed to protect the bottom electrode from oxidation, but it is difficult to obtain a well-protecting layer with minimal parasitic effects (e.g. non-tunable capacitance).

SUMMARY OF THE INVENTION

The object of the present invention is to provide a method of manufacturing bulk acoustic wave filters.

More particularly, it is the object of certain embodiments of the present invention to provide methods of manufacturing laterally coupled bulk acoustic wave (LBAW) thin film filters.

Additionally, certain embodiments of the present invention relate to a parallel-plate structure fabrication method. Particularly, certain embodiments relate to a parallel-plate structure fabrication method for ferroelectric and piezoelectric thin film structure and to a fabrication method for integrated structures based on said structures and, e.g. thick metal inductors.

Certain embodiments of the present invention further relate to parallel-plate structures, and, particularly, to e.g. ferroelectric and piezoelectric thin film structures and integrated structures based on the said structures and e.g. thick metal inductors.

It is an aspect of certain embodiments of the present invention to provide a fabrication method which is based on layer transfer fabrication techniques and utilizes an auxiliary substrate on which the BST, or a corresponding middle layer, is first deposited.

As such, BST, or another suitable material, is grown first and the top and bottom electrodes are essentially deposited afterwards utilizing layer transfer. Characteristic features of the present invention are in detail presented in the enclosed claims.

Some advantages which can be realized through aspects of certain embodiments of the present invention are:

BST or corresponding middle layer growth can be done in optimal conditions to obtain high BST or corresponding middle layer quality. For example, high growth temperatures and the highly oxidizing growth atmosphere can be used without the risk of electrode destruction.

a wide variety of metals, including e.g. Cu, can be used for electrodes as metal oxidation and/or high-temperature grain growth are no more an issue all key layers (bottom metal electrode, middle layer, like BST, top metal electrode) can be patterned. In particular, contacts to bottom electrode can be easily made by employing a structure where two capacitors are connected in series and are inversely biased, the even-order nonlinearities will be removed or strongly attenuated, it is possible to implement integrated structures including tunable capacitors and additional integrated components such as (i) several inductors or further capacitors, (ii) resistors (e.g. for biasing), (iii) non-tunable capacitors, the process can be integrated as part of IPD (Integrated Passive Device) fabrication process. Tunable, low-loss capacitors combined with high-Q inductors (thick Cu, low-loss glass substrate), integrated resistors, etc. allow the creation of attractive applications such as excellent phase noise VCO:s, tunable impedance matching networks or filters, etc.

Furthermore, it is an object of some embodiments of the present invention to provide a filter and methods for manufacturing said filter which are capable of balanced to unbalanced signal transformation.

An LBAW filter according to an embodiment of the present invention is characterized by having a single piezoelectric layer having electrodes on both a top and bottom surface.

It is also an aspect of some embodiments of the present invention to provide a filter and methods for manufacturing said filter which are capable of unbalanced to balanced signal transformation which overcome at least some of the disadvantages of the prior art. It is a further aspect of some embodiments of the present invention to provide a filter and methods for manufacturing said filter which are capable of balanced to balanced signal transformation which overcome at least some of the disadvantages of the prior art.

Furthermore, it is an aspect of some embodiments of the present invention that impedance transformation can be realized.

In LBAW filters, balun conversion is possible when the bottom electrode is patterned to correspond to the top electrode. Then, one signal of the balanced port can be taken from the top of the piezoelectric layer and the other signal from the bottom of the single piezoelectric layer.

Typically, the coupled electrodes in LBAW components should be narrow, e.g. interdigital fingers. Due to this structure it makes possible the impedance transformation between input and output ports. However, patterning of a bottom electrode into narrow fingers or other narrow patterns creates multiple steps in the bottom electrode area. Piezoelectric material, such as AlN, can have difficulties growing well on such steps because discontinuities in the underlying material may cause crystal defects.

Therefore, there is herein described a method of manufacturing LBAW components according to embodiments of the present invention which is independent of piezoelectric material selection.

Due to the design of LBAW devices according to embodiments of the present invention there are realized several distinct advantages over the prior art. Since only one piezoelectric layer is necessary in certain embodiments, the coupling is not particularly sensitive to its thickness. This makes the fabrication process simpler and less expensive. Additionally, as LBAW devices can be realized on thin films, the devices are easily capable of operation at GHz frequencies.

BRIEF DESCRIPTION OF THE DRAWINGS

The foregoing, and additional aspects, features and advantages of the present invention will be more clearly understood from the following detailed description of preferred embodiments of the present invention, taken in conjunction with the accompanying drawings, in which.

DETAILED DESCRIPTION OF EXEMPLARY EMBODIMENTS

Figure 1:
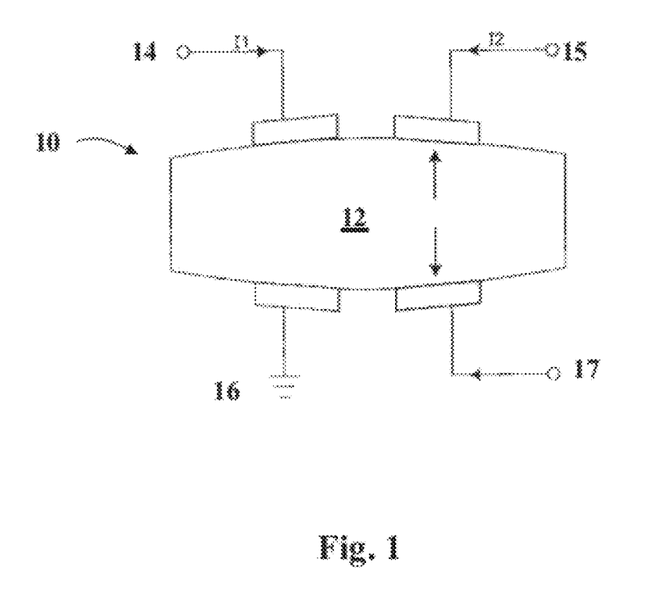
FIG. 1 presents a principle of LBAW balun filters. Acoustic vibration is excited in a piezoelectric thin film layer. Port 1 is unbalanced and port 2 is balanced. Balanced signals have opposite phase and are taken from the top and bottom of the piezoelectric layer.

The general operation principle of a balun LBAW filter 10 is depicted in FIG. 1. In the example of FIG. 1, unbalanced signal 14 is input to the balun LBAW filter 10 on a first side of a piezoelectric layer 12. Opposite-phased signals 15 and 17 in the balanced port are then taken from opposite sides of the piezoelectric layer 12. Additionally, there is a ground 16 located opposite the input 14. The input and output ports can be interchanged to obtain balanced input and unbalanced output.

Figure 2:
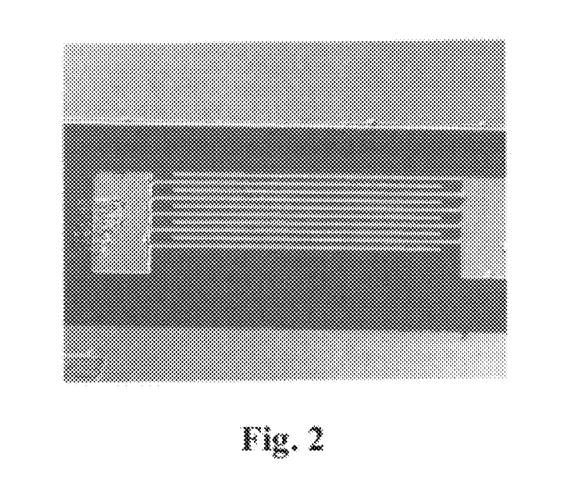
FIG. 2 presents a SEM image of a LBAW filter (top electrode). Electrode length is 300 µm and width and gaps are less than 5 µm. Balun function requires the patterning of bottom electrode into a similar structure. Other electrode configurations and shapes are possible.

FIG. 2 shows an example of an LBAW filter electrode structure. One side of the finger electrodes is the input port while the other side is the output port. In general, however, the electrodes need not be alternatingly connected to input and output ports. Some electrodes may be grounded while other may be left floating. Also, the number of ports is not restricted to 2. Electrode and gap widths are also not restricted but can vary within the electrode structure. In a balun filter, the bottom electrodes should be patterned in a corresponding manner as the top electrodes. More specifically, the bottom electrode should be similar and match the top electrode. One of the additional advantages to a balun LBAW filter is that the structure can also realize an impedance transformation.

In the present invention, a thin film balun filter is realized using LBAW technology. Acoustic vibration is generated in a piezoelectric thin film. Example materials that are usable for such a thin film are as AlN, ZnO and PZT. One of ordinary skill in the art will recognize other suitable piezoelectric materials.

The frequency response, central operating frequency and bandwidth, of the device is determined primarily by the piezoelectric material used, the thickness of the piezoelectric layer, the composition of nearby layers and to some extent the dimensions of the electrodes. A signal conversion is created by patterning the bottom electrode to correspond to the top electrode. A number of different structures and patterns can be used for the top electrode, for example a finger structure as shown in FIG. 2, as long as the bottom electrode corresponds.

Several problems arise in the fabrication process when attempting to create a device having a piezoelectric layer with electrodes on the bottom side of the piezoelectric layer. Patterning of a bottom electrode into narrow fingers or other narrow patterns creates multiple steps in the bottom electrode area. Piezoelectric material, such as AlN, can have difficulties growing well on such steps because discontinuities in the underlying material may cause crystal defects.

Therefore, although it is disadvantageous to merely fabricate a bottom electrode, then grow a piezoelectric layer and finally fabricate a top electrode on the new top surface of the piezoelectric layer, it is a possible method for creating a device according to the present invention.

The smooth surface required by the piezoelectric layer can be obtained by filling the gaps between a patterned bottom electrode, for example using a SiO2 layer, and then polishing the surface (CMP). This process, planarizing, requires that the electrode material is compatible with the CMP process.

The CMP process described above is material-dependent and limits the electrode materials. To achieve maximal lateral coupling it is better to be able to choose the materials more freely. A materials-independent way to combine a high-quality piezoelectric film to any electrode material is a layer transfer technique (LTT). A more detailed description of LTT is described in patent publications FI20060832, US 2010/0067167 and WO 2008/034940, the subject matter of which is herein incorporated by reference.

Therefore, there is herein described an exemplary method for fabricating a device according to the present invention. FIGS. 3a-f show a method of fabrication for a balun LBAW 30 using a layer transfer technique (LTT). Here the piezoelectric film can be deposited first and the bottom electrode processed on top of it. Using wafer bonding the piezoelectric layer and the electrode are transferred to another wafer, after which the process can be continued on top of the piezoelectric layer.

Figure 3A:
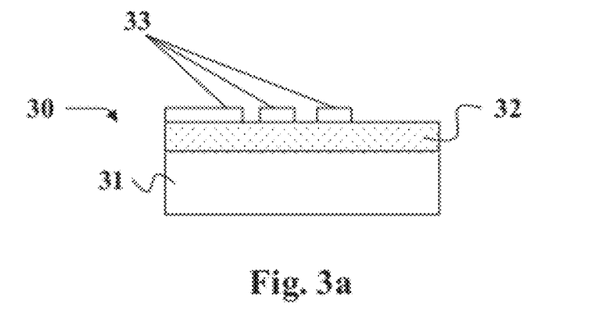
FIG. 3a to 3f presents a fabrication steps for fabricating an LBAW filter using a layer transfer technique (LTT).
Figure 3B:
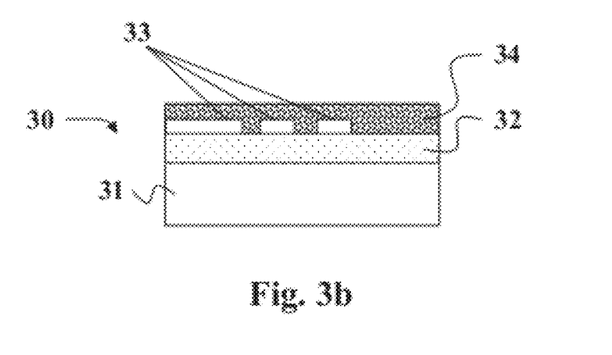

FIG. 3a shows a piezoelectric layer 32 which has been grown on a substrate 31. An example of a suitable substrate is Si. The important characteristic of substrate 31 is that the desired piezoelectric material which makes up the piezoelectric layer 32 should grow well on it. Since the substrate 31 will not normally make up a part of the final device, the selection of the substrate material is not limited to any particular material. Once a piezoelectric layer is formed on the substrate 31 then the bottom electrode 33 can be fabricated on the free surface of the piezoelectric layer 32. Electrode 33 can be patterned by any suitable method known in the art. On top of the patterned bottom electrode 33 a dielectric layer 34 is deposited and polished as shown in FIG. 3b.

The dielectric layer 34 will eventually form the first layer below the piezoelectric layer in the final thin-film. The advantage to the present approach is that dielectric materials are not as affected by the multiple steps of the bottom electrode as growing a piezoelectric layer is when grown on the bottom electrode. Once the dielectric material is deposited and polished then there is a fresh, polished surface on which another layer of the thin-film can be formed.

The acoustic properties of the filter, i.e. the thin film composition and the layer stack, must be designed such that the acoustic coupling between electrodes is possible, and the acoustic energy does not escape from the device. Coupling between electrodes can be realized either with an evanescent of with a propagating wave.

Figure 3C:
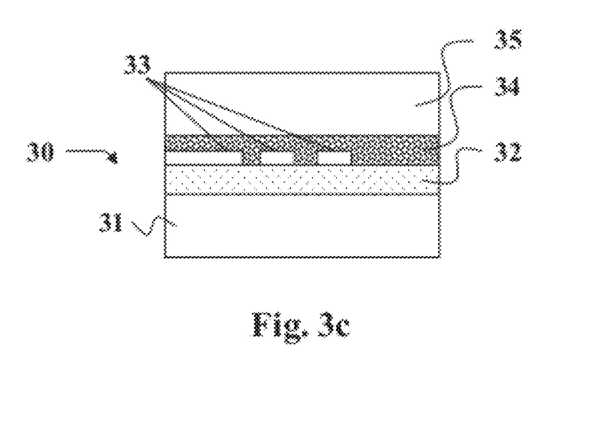

FIG. 3c shows layer 35 which is formed on top of the dielectric layer 34. Layer 35 can be one or more prefabricated layers which will form part or all of the final thin-film. For example, layer 35 can be a carrier wafer which is bonded to the polished surface by any well known process. At this point, additional layers can be added if desired or the process can continue to creating the top electrode.

Figure 3D:
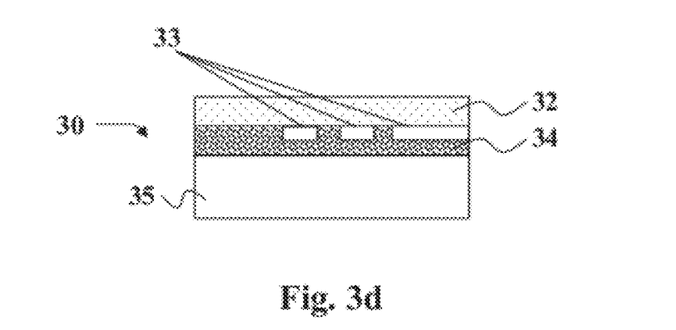

FIG. 3d shows the device 30 of FIG. 3c inverted and with the substrate 31 removed. Substrate 31 can be removed with any known method such as thinning or etching so as to expose at least a portion of the piezoelectric layer 32. Although it is not necessary, it is often ideal to remove all of the substrate material 31. Additionally, it is possible at this stage to modify the now open surface of the piezoelectric layer 32 by adding or removing material if necessary.

Figure 3E:
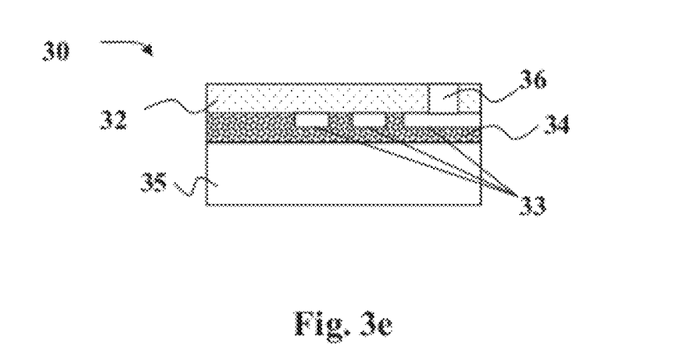

At one or more locations on the piezoelectric layer it can be required to form an electrical via to connect one or more portions of the bottom electrode to the top electrode. FIG. 3e, as an example, shows an electrical via 36 formed at an output end of device 30. Any suitable method for creating such an electrical via, known in the art, can be used where desired.

Figure 3F:
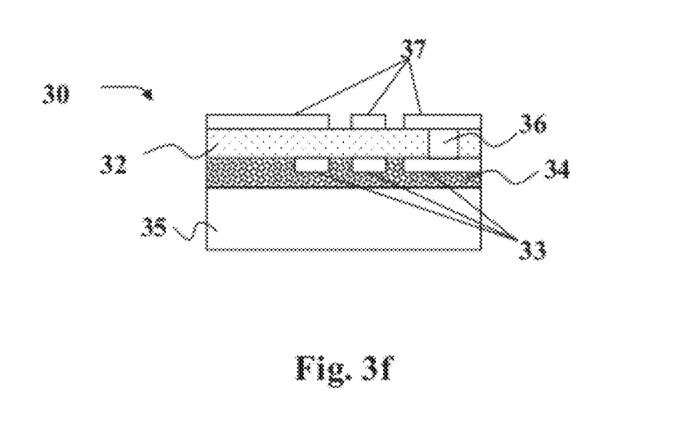

On top of the prepared open surface of the piezoelectric layer 32, now the top surface either with or without one or more electrical vias, the top electrode 37 is manufactured. As discussed above, it is important to pattern the top electrode 37 so that it corresponds to the previously manufactured bottom electrode 33, as shown in FIG. 3f. The device of FIG. 3f can be a complete device or it can proceed to further necessary manufacturing steps as required.

A balun LBAW filter according to the present invention can be realized in several embodiments. Examples of such embodiments which will be discussed herein are on an acoustic mirror and on an air-gap. The present invention is not limited to the example embodiments herein described. One of ordinary skill in the art may recognize other embodiments of a balun LBAW filter according to the present invention which do not depart from the scope of the present application.

Figure 4:
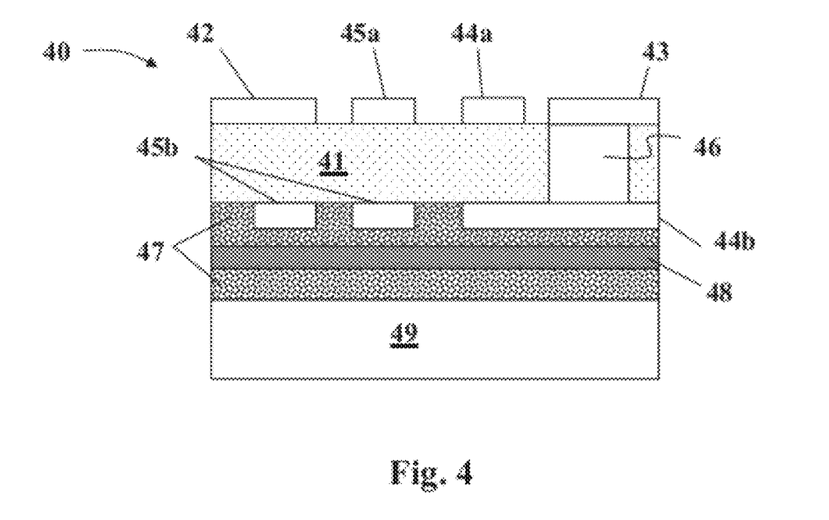
FIG. 4 presents an LBAW balun filter on an acoustic mirror.

An acoustic mirror, or acoustic Bragg reflector, is composed of thin film layers 47 and 48 with alternating high and low acoustic impedances, for example W and SiO2. An example of a balun LBAW filter on an acoustic mirror 40 is shown in FIG. 4. Using an acoustic mirror gives flexibility to the design of the filter's acoustic properties. In a balun filter it may be necessary to use a wholly dielectric mirror to avoid electrical parasitic capacitances.

FIG. 4 shows the balun LBAW filter 40 with a piezoelectric layer 41 having a top electrode (42, 45a, 44a, 43) on a first, top, surface and a bottom electrode (45b, 44b) on a second, bottom, surface. While only a few electrodes are shown, the number of electrodes may be chosen appropriately so that the desired frequency response is obtained. Below the piezoelectric layer is the Bragg reflector consisting of low acoustic impedance layers 47, which can be SiO2, alternated with high acoustic impedance layers 48, which can be W. While only three layers are shown, an appropriate number of additional alternating layers with the same, similar or different materials can be added. The Bragg reflector is then supported by the substrate 49.

It can be seen from FIG. 4 that the top and bottom electrodes, though not identical, correspond to each other. The top electrode includes an input electrode 42 and a first output 44a. Connected to the top electrode by 43 and an electrical via 46 is the output of the bottom electrode, 44b. An LBAW balun filter on a mirror can be processed using any of the above described techniques.

Figure 5:
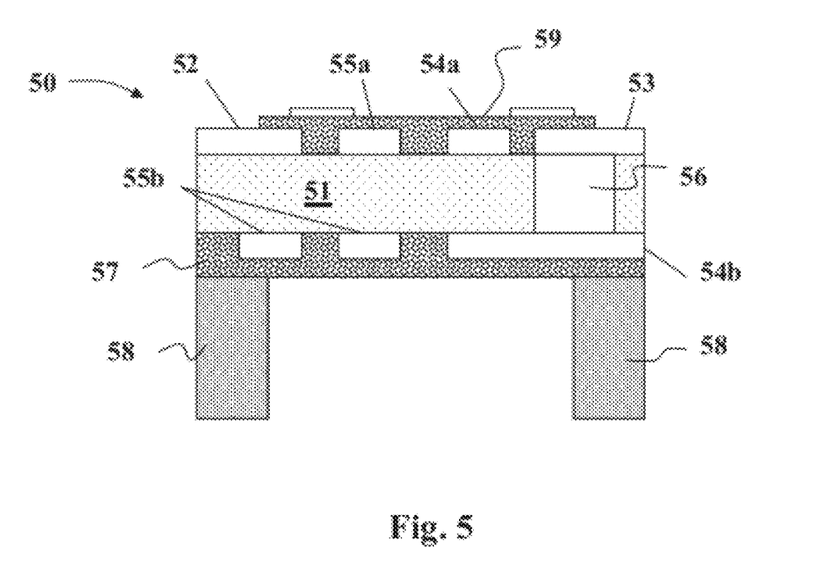
FIG. 5 presents an LBAW balun filter on an air gap.

A balun LBAW filter with an air gap, as shown in FIG. 5, requires fewer layers than a mirror stack. However, its acoustic properties cannot be modified as freely as those of a mirror structure. Patterning of an air gap structure can be realized either with planarization or with LTT. The structure can be released, for example, by etching through the substrate 58 from the back side. Alternatively, it can be achieved by doing a release etch from the top with the help of release holes. The film can also be transferred onto a cavity-SOI wafer. To design the acoustic properties, the materials can be selected appropriately and/or an extra layer or layers 59 can be deposited on top of the structure. FIG. 5 shows an LBAW balun filter 50 on an air gap with a piezoelectric layer 51 having a top electrode (52, 55a, 54a, 53) on a first, top, surface and a bottom electrode (55b, 54b) on a second, bottom, surface. Below the piezoelectric layer is air gap fabricated into substrate 58 with structures supported by the dielectric material layer 57, which can be SiO2.

It can be seen from FIG. 5 that the top and bottom electrodes, though not identical, correspond to each other. The top electrode includes an input 52 and a first output 53. Connected to the top output 53 by an electrical via 56 is the output of the bottom electrode 54b. The second output of the balanced signal is taken from electrode 54a.

Typically, the coupled electrodes in LBAW components should be narrow, e.g. interdigital fingers. For example, depending on the operation frequency, the electrodes should normally be of the order of around 1 to 10 μm. For example, the electrodes, top and/or bottom, should be manufactured having widths between 0.01 to 100 μm, preferably between 0.01 to 50 μm, more preferably between, 0.05 to 15 μm.

In some embodiments, the electrodes should be even narrower, such as on the order of the lateral wavelength at the desired operation frequency. For example, such electrodes should be ±50% of the lateral wavelength of a desired operation frequency, preferably ±20% of the lateral wavelength of a desired operation frequency, more preferably ±10% of the lateral wavelength of a desired operation frequency.

Impedance transformation can be realized as an aspect of the present invention. The impedance levels at input and output can be modified by designing the electrode structures appropriately. Compared to a corresponding single-single filter, a balun filter has double impedance in its output port. Therefore, if an unbalanced component is designed for 50 Ohms, a similar balun filter with balanced output transforms the impedance from 50 to 100 Ohms.

Port impedance can also be modified by modifying a port's static capacitance C0. Static capacitance is affected by the area of the electrode(s), which can be changed by changing the width, shape, or number of electrodes. Both input and output port impedances can be modified this way.

Devices according to the present invention generally have the advantages over the prior art of simpler and therefore less expensive fabrication process especially when compared to vertically coupled BAW filters. The use of LTT makes manufacture in material independent allowing for better device design. Additionally, the better power handling, especially when compared to SAW filters allows for smaller size and higher operation frequencies.

Devices according to embodiments of the present invention can be used in at least the following applications; small size RF balun filters, for example in cell phones, WLAN and other wireless devices, especially at GHz frequencies. While the present invention has been described with the aid of the drawings and exemplary embodiments, one of ordinary skill in the art will recognize variations not disclosed herein but which do not part from the scope of the present invention.

FIGS. 6a to 6d present process schematics for thin film capacitor fabrication via layer transfer method in accordance with aspects of certain embodiments of the present invention as described above and herein below. The middle ferroelectric or piezoelectric (e.g. BST) layer 102 is sandwiched between two (top and bottom) metallic electrodes 101, 103 (see e.g. FIG. 6d).

Figure 6A:
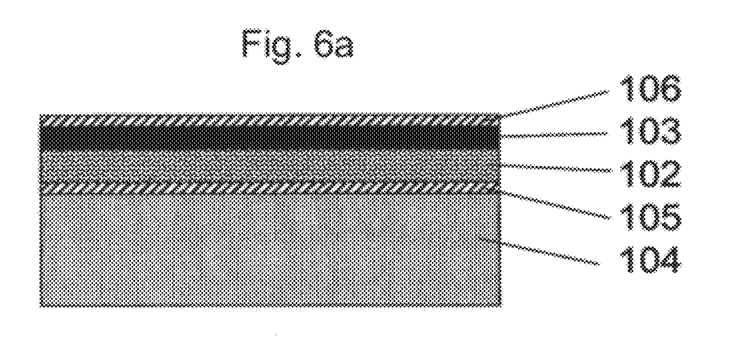
FIGS. 6a to 6d present process schematics for ferroelectric or piezoelectric (e.g. BST) thin film capacitor fabrication via layer transfer method.
Figure 6B:
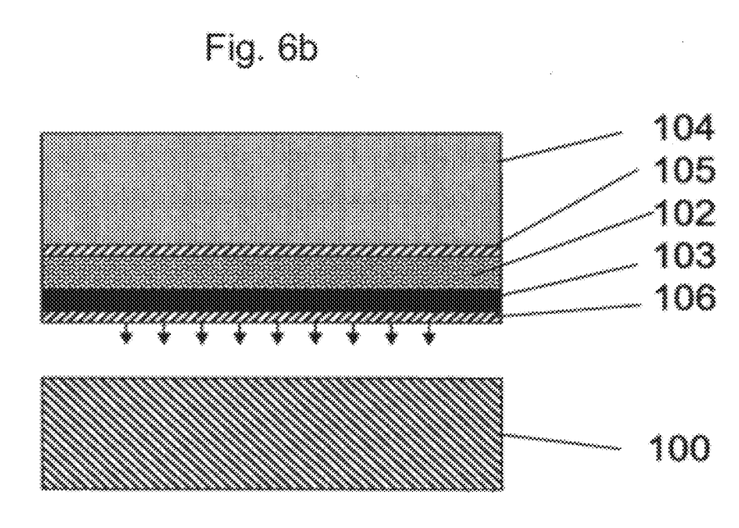
Figure 6C:
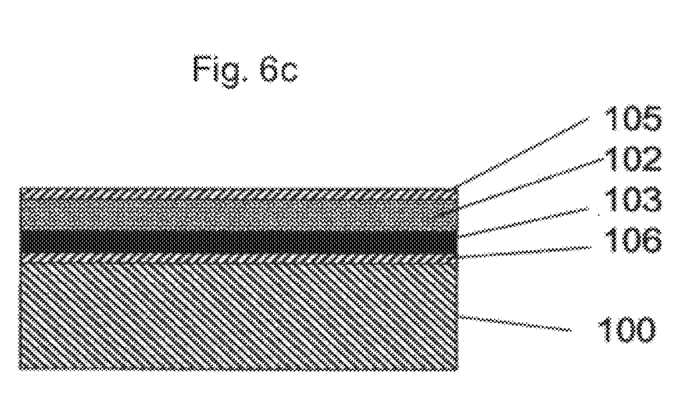
Figure 6D:
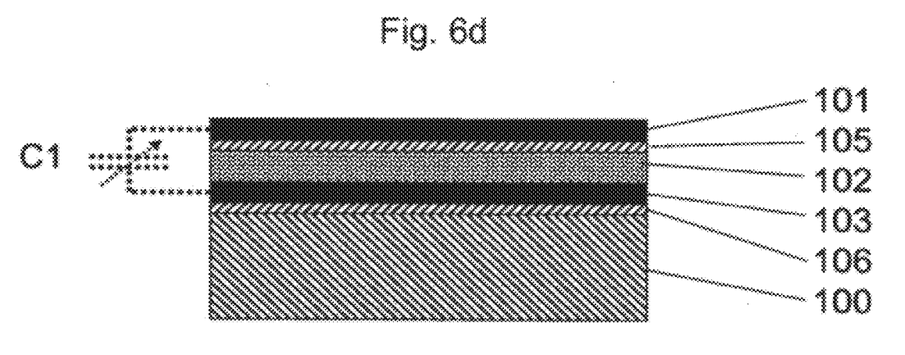

The method is in detail illustrated in the following with reference to the following process steps: (1-2) BST growth and bottom electrode deposition on the first substrate (FIG. 6a), (3) layer transfer from the first substrate to the second substrate (FIG. 6b), (4) first substrate removal (FIGS. 6c), and (5) top electrode deposition and (FIG. 6d).

In the processing method, as outlined in FIG. 6, the metal-oxide layer 102 is grown first and the top and bottom electrodes 101, 103 are essentially deposited second utilizing layer transfer.

(1) BST is grown on a first (auxiliary) substrate 104 (e.g. Si). The substrate will be later removed and therefore is to be suitably selected for this purpose. For optimal BST growth, a suitable seed layer 105 may be grown on substrate. Seed layer is optional and can be e.g. pure $SiO_2$ or thin Pt on $SiO_2$. As both bottom and top metal electrodes are in essence deposited after BST growth, the BST growth conditions can be chosen for optimal BST growth: e.g. optimally high temperatures can be used without the deterioration of metallic electrode.

(2) Bottom electrode 103 deposition after BST growth, on top of BST. The electrode metal can be rather freely selected, in particular it can be e.g. Cu, Al, Ag or Au. Since metal deposition can be done at low temperatures (e.g. T<200° C.), and oxygen is highly bound to already grown BST, the deposited metal is not heavily attacked by oxygen or temperature. The bottom metal electrode 103 can be patterned. Next, a buffer layer 106 is grown (e.g. thick $SiO_2$) which is planarized. The role of the buffer layer is to allow wafer bonding to a second (bottom) substrate 100 (e.g. glass). Alternatively, the buffer layer can be e.g. a polymer film (e.g. BCB, polyimide) deposited e.g. using spin coating.

(3) BST layer 102 transfer to a second substrate 100. The prepared BST wafer is bonded with the second substrate (e.g. glass).

(4) The first substrate removal after wafer bonding. Possible methods include, for example: (i) chemical wet-etching of Si (HF+HNO3+CH3COOH), (ii) chemical-mechanical thinning (grinding, polishing) followed by plasma etching (e.g. ICP, DRIE). Key aspect in removal of the first substrate is etch selectivity: (a) e.g. seed layer of thin Pt can act as the etch stop after first substrate is removed, (b) the second substrate and BST are to be selective to the first substrate removal or are to be protected. The seed layer 105, if applied, can be optionally also removed before top electrode deposition.

(5) Top electrode 101 deposition. Metal can be freely selected as for the bottom electrode. As a result, the capacitor C1 having bottom and top electrodes 103, 101 and a middle layer 102 has been fabricated.

Figure 7:
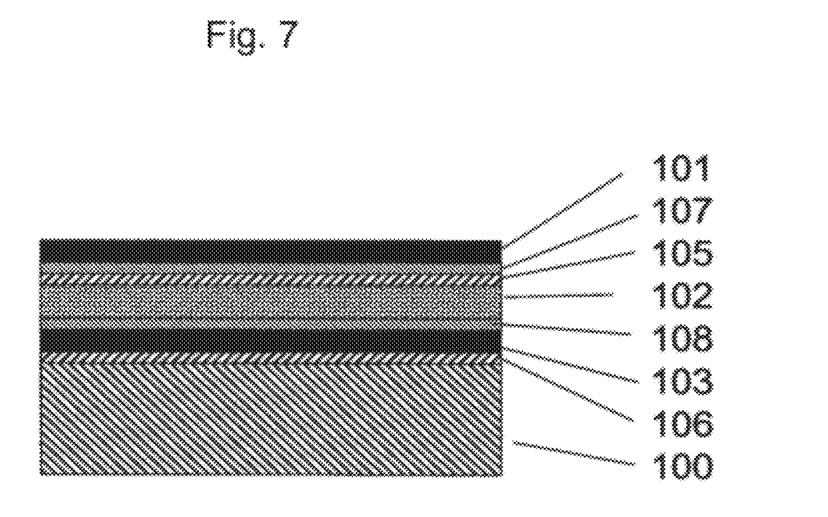
FIG. 7 presents a preferred embodiment of including layers acting to improve electrode material adhesion and/or to served as diffusion barriers.

Additional layers serving as adhesion layers and/or diffusion barriers 107, 108 can be employed (e.g. TiW) between the BST and the top and the bottom electrodes as shown in FIG. 7).

Patterning of the layers to obtain desired capacitor structures. As shown as an example in FIG. 8a, the top electrode layer 111, the seed layer 115 for BST growth, the BST layer 112, and the bottom electrode layer 113 embedded in a top planarization layer 110 are patterned to create a two-capacitors-in-series structure accessible via the top metal contacts. In particular, the BST layer can be patterned before wafer bonding to control strain when transferring the BST thin film from the first substrate to the second substrate—i.e. to avoid BST cracking.

Figure 8A:
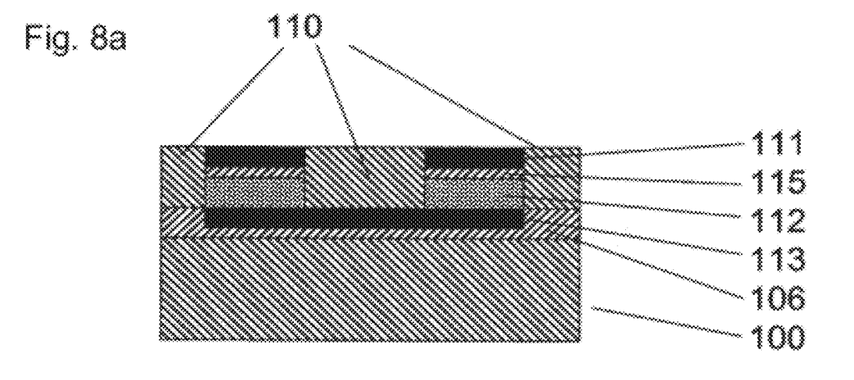
FIGS. 8a and 8b present preferred embodiments, where the processed layers, in particular the middle (e.g. BST) layer and the electrode layers, are patterned to create desired capacitor structures.
Figure 8B:
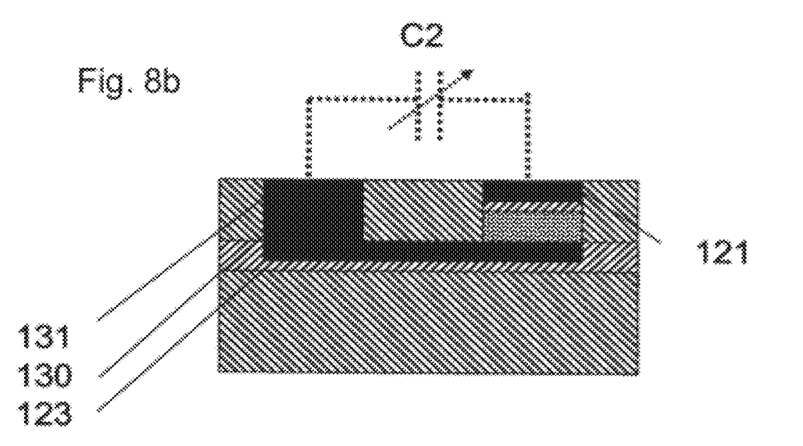

The process sequence easily allows also processing to create an ohmic contact creation to the bottom electrode 123 from the top metal 121 as shown in FIG. 8b presenting the top electrode including a contact 130 to the bottom electrode. The capacitor C2 is formed between the top and bottom layers wherein further the bottom electrode is connected to another area 131 on the top layer in order to get an external contact.

Figure 9A:
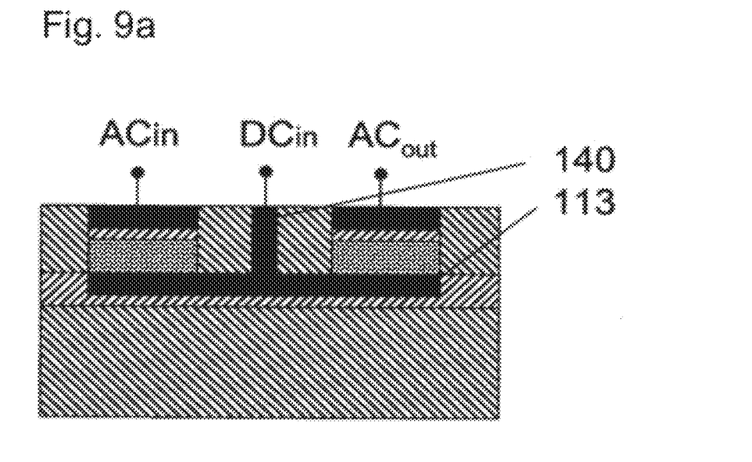
FIGS. 9a and 9b present a preferred embodiment where two ferroelectric capacitors are placed in series and a DC contact is created to the (bottom) electrode contacting the two capacitors.
Figure 9B:
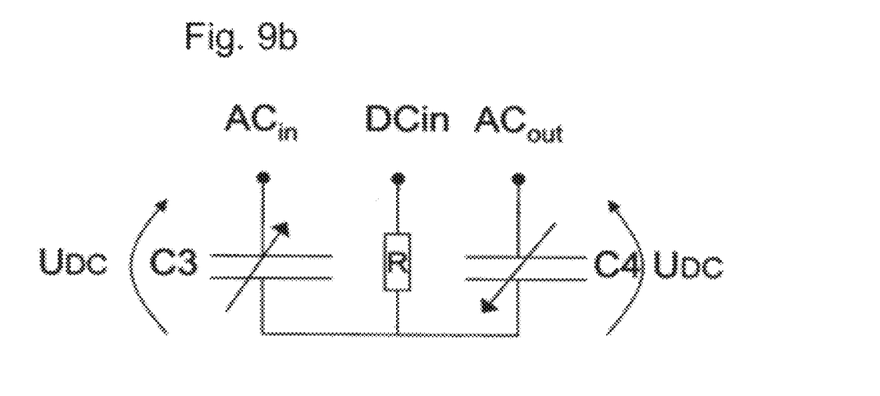

FIG. 9a shows a schematic structure where a DC contact 140 is realized to the bottom electrode 113 (see FIG. 8a). The bottom electrode connects the two ferroelectric (tunable) capacitors in C3, C4 series. By connecting a tuning DC voltage DCin (typically via a high impedance route as illustrated by the resistor R in FIG. 9b) to the bottom electrode, the two capacitors will be inversely biased, that is, the bias voltage UDC will be parallel to AC signal in one of the capacitors C3 while being antiparallel in the other capacitor C4. The key advantages of the preferred embodiment shown in FIGS. 9a and 9b are: (i) the even order nonlinearities (e.g. even harmonics) will be removed or strongly attenuated due to inverse biasing, (ii) a DC-block is realized to prevent the DC-voltage reaching the AC-contacts ACin, ACout. If desired, several copies of the structure described by FIGS. 9a and 9b can be connected in series to gain additional advantages.

Figure 10A:
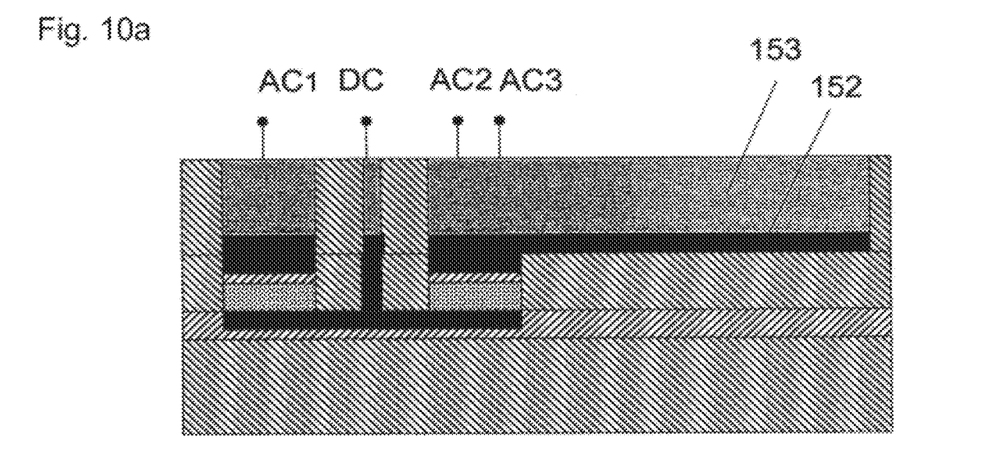
FIGS. 10a to 10c present a side view and top view as well as coupling schema of a preferred embodiment where electrode position is employed to realize low-loss inductor structures via the thick top electrode layer, thereby allowing integrated, high-performance tuneable LC-structures.
Figure 10B:
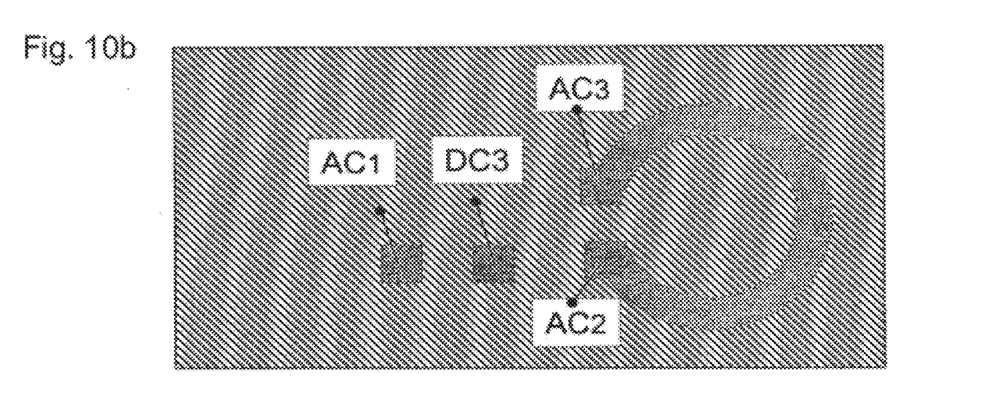
Figure 10C:
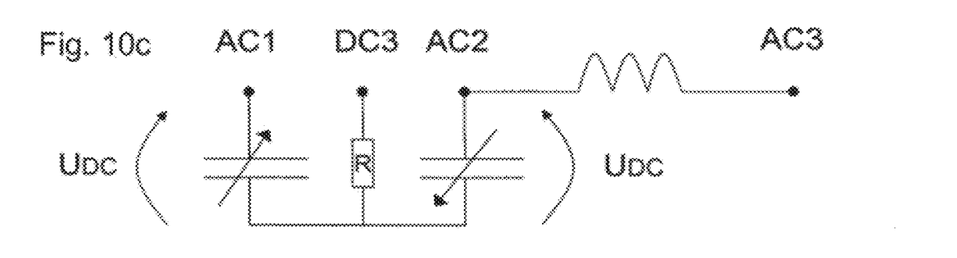

Thick metal deposition methods, electrode position growth in particular, can be applied to obtain thick top metal conductors. As shown in FIG. 10a, the top electrode is on the contrary to FIG. 6d essentially thicker than the bottom electrode and consists of two layers 152, 153, the first layer 152 being a thin layer and the second layer 153 being a galvanic grown thicker layer 153 (typical thickness ratio 1:10 between the layer thicknesses). As further shown in FIGS. 10a to 10c, the thick top metal layer is utilized to create a low-loss (high-Q) inductor, which is connected with the dual inversely biased tuneable capacitor structure described in FIGS. 9a and 9b. The resulting integrated structure has four electrical connections (AC1, AC2, AC3, DC3) which can be used to access a tuneable, high-Q LC-circuit (parallel or series configuration). Such a tuneable, high-Q LC-circuit can be used e.g. to realize a high performance voltage controlled oscillator (VCO) where the high tank Q-value, due to low-loss inductor and low-loss capacitors, results in excellent phase noise performance. Another key feature is the small second order nonlinearity due to inversely biased capacitors-configuration, which critically reduces the up-mixing of 1/f-noise.

Figure 11A:
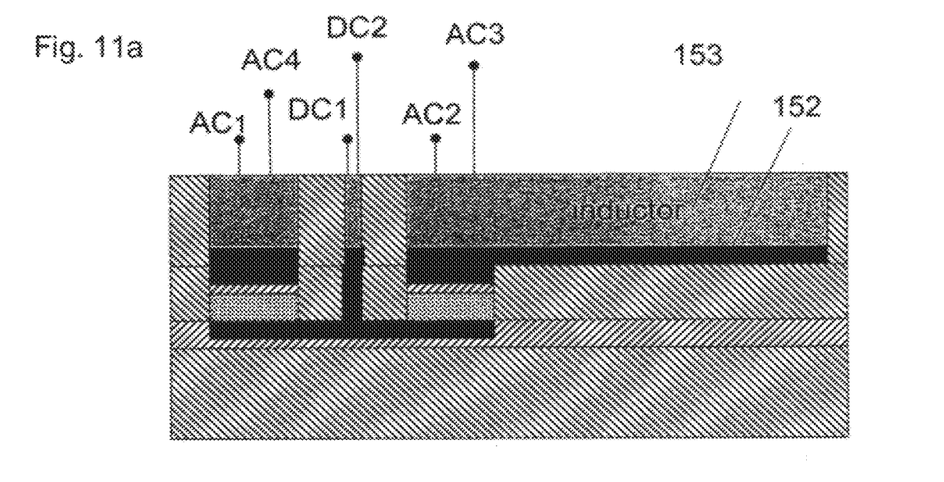
FIGS. 11a to 11c present a side view and top view as well as coupling schema of another preferred embodiment where the low-loss inductor structures and the ferroelectric capacitors are used to realize an integrated, tuneable impedance matching circuit.
Figure 11B:
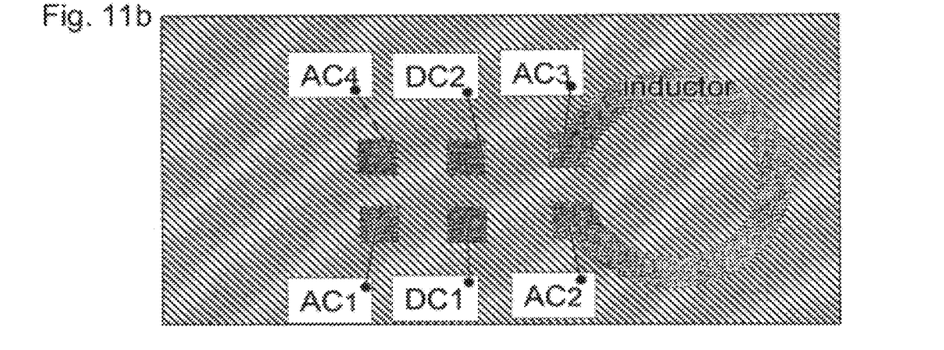
Figure 11C:
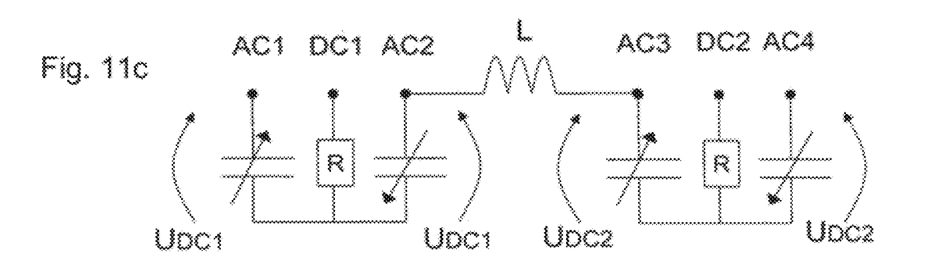

Another preferred embodiment based on integrated low-loss inductors and tuneable, ferroelectric capacitors is shown in FIG. 11a to 11c, in which a first capacitor structure (accessible via contacts AC1 and AC2, tuning voltage inserted via DC1), a low-loss inductor L, and a second capacitor structure (accessible via contacts AC3 and AC4, tuning voltage inserted via DC2) are connected. A tuneable "pi-network", typically used as impedance matching network, can be realized e.g. by connecting contacts AC1 and AC4 to ground, using AC2 and AC3 as AC signal input and output, respectively, and using DC1 and DC2 as biasing voltage inputs to tune the first and the second capacitor structures. Of particular importance is again the capacitor structure in which the two capacitors are inversely biased resulting in low even-order nonlinearities, critical e.g. for harmonic distortion generation in wireless applications.

It is obvious to the person skilled in the art that the integrated structure described in FIGS. 9a to 11c may also include additional integrated components such as (i) several inductors or further capacitors, (ii) resistors (e.g. for biasing), (iii) non-tuneable capacitors, etc. It is also obvious that the described structures are schematic and may not reflect the true dimensions or the true shape of the fabricated structures.

It is also obvious to the person skilled in the art that different embodiments of the invention are not limited to the examples described above, but that they may be varied within the scope of the enclosed claims. The process sequence is illustrated using BST as an example, but the method is applicable to any perovskite metal-oxide, or similar material, such as ZnO, AlN, $SiO_2$, $Si_3N_4$, CN, etc., that requires processing conditions destructive for the electrodes. It is also obvious that the capacitors may serve not only as lumped elements but also as part of distributed structures such as transmission lines. It is further obvious to the person skilled in the art that the present invention may be applied to the parallel plate structures that exhibit acoustic resonances which are transduced via piezoelectric or electrostrictive middle layer. Such structures can thus be operated as a FBAR (Thin Film Bulk Acoustic Resonator) or as a TFBAR (Tunable Thin Film Bulk Acoustic Resonator). Further, the structure may contain additional layers acting as acoustic mirrors.

The invention claimed is:

1. A method of manufacturing a laterally coupled bulk acoustic wave element comprising the steps of:
   fabricating one or more first electrodes on a first surface of a piezoelectric layer,
   forming a dielectric layer on at least a portion of an exposed first surface of the piezoelectric layer and at least a portion of the one or more first electrodes, and
   fabricating one or more second electrodes on a second surface of the piezoelectric layer opposite of the first surface, wherein the second electrodes correspond to the first electrodes
      wherein the fabricating of the one or more first electrodes on the first surface of the piezoelectric layer occurs when the piezoelectric layer has a substrate affixed to the second surface thereof, and wherein the substrate affixed to the second surface of the piezoelectric layer is removed prior to fabricating the one or more second electrodes.

2. The method in accordance with claim 1, wherein the fabricating one or more first electrodes on a first surface of a piezoelectric layer is followed by forming a dielectric layer on at least a portion of an exposed first surface of the piezoelectric layer and at least a portion of the one or more first electrodes, which is followed by fabricating one or more second electrodes on a second surface of the piezoelectric layer opposite of the first surface.

3. The method in accordance with claim 1, further comprising;
   planarizing the exposed surface of the dielectric layer, and
   forming one or more additional layers on the planarized surface of the dielectric layer.

4. The method in accordance with claim 3, further comprising;
    forming one or more additional layers (35) including bonding one or more prefabricated layers.
5. The method in accordance with claim 4, wherein,
    the one or more prefabricated layers is a carrier wafer.
6. The method in accordance with claim 3, wherein,
    the one or more additional layers is part or all of an acoustic mirror or an air-gap structure.
7. The method in accordance with claim 1, wherein the fabricating of the one or more first electrodes and the fabricating of the one or more second electrodes includes selecting an area for the electrode to provide a desired impedance level transformation.
8. The method in accordance with claim 1, wherein said fabricating of the first or second electrodes results in electrodes that are interdigital fingers.
9. The method in accordance with claim 1, wherein the fabricating of the at least one of said first or second electrodes results in electrodes having widths of a desired operation frequency of the LBAW element.
10. The method in accordance with claim 9, wherein the fabrication of at least one of said first or second electrodes results in electrodes having electrode widths between ±50% of the lateral wavelength of a desired operation frequency.
11. The method in accordance with claim 1, at least one of said first second electrodes are fabricated having widths between 0.01 to 100 µm.
12. The method in accordance with claim 1, wherein said first and second electrodes are not identical.
13. The method in accordance with claim 1, further comprising the steps of fabricating at least one port and/or input on one or more sides of said piezoelectric layer.
14. The method according to claim 13, wherein a plurality of ports are arranged with respect to each other such that balanced-unbalanced signal conversion is achievable by said LBAW element.
15. A method of manufacturing a laterally coupled bulk acoustic wave element comprising the steps of:
    fabricating one or more first electrodes on a first surface of a piezoelectric layer,
    forming a dielectric layer on at least a portion of an exposed first surface of the piezoelectric layer and at least a portion of the one or more first electrodes,
    fabricating one or more second electrodes on a second surface of the piezoelectric layer opposite of the first surface, wherein the second electrodes correspond to the first electrodes, and
    fabricating at least one port and/or input on one or more sides of said piezoelectric layer.
16. The method according to claim 15, wherein a plurality of ports are arranged with respect to each other such that balanced-unbalanced signal conversion is achievable by said LBAW element.

* * * * *